United States Patent
Ogata et al.

(10) Patent No.: US 12,044,969 B2
(45) Date of Patent: Jul. 23, 2024

(54) RESIST UNDERLAYER FILM-FORMING COMPOSITION

(71) Applicant: NISSAN CHEMICAL CORPORATION, Tokyo (JP)

(72) Inventors: Hiroto Ogata, Toyama (JP); Hikaru Tokunaga, Toyama (JP); Hirokazu Nishimaki, Toyama (JP); Makoto Nakajima, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 496 days.

(21) Appl. No.: 17/438,786

(22) PCT Filed: Mar. 5, 2020

(86) PCT No.: PCT/JP2020/009438
§ 371 (c)(1),
(2) Date: Sep. 13, 2021

(87) PCT Pub. No.: WO2020/184380
PCT Pub. Date: Sep. 17, 2020

(65) Prior Publication Data
US 2022/0146939 A1    May 12, 2022

(30) Foreign Application Priority Data

Mar. 12, 2019  (JP) .................... 2019-044874

(51) Int. Cl.
| | | |
|---|---|---|
| H01L 51/00 | (2006.01) | |
| C08G 59/24 | (2006.01) | |
| G03F 7/11 | (2006.01) | |
| H01L 21/3105 | (2006.01) | |

(52) U.S. Cl.
CPC ............... *G03F 7/11* (2013.01); *C08G 59/24* (2013.01); *C08G 59/245* (2013.01); *H01L 21/31058* (2013.01)

(58) Field of Classification Search
CPC . G03F 7/11; G03F 7/094; G03F 7/091; G03F 7/16; G03F 7/20; G03F 7/26; C08G 59/24; C08G 59/245; C08G 2650/56; H01L 21/31058; H01L 21/027; C08L 71/00; G03G 7/11
See application file for complete search history.

(56) References Cited

U.S. PATENT DOCUMENTS

| | | |
|---|---|---|
| 2004/0048196 A1 | 3/2004 | Shao et al. |
| 2018/0107116 A1 | 4/2018 | Asai et al. |

FOREIGN PATENT DOCUMENTS

| | | |
|---|---|---|
| JP | 2004-533637 A | 11/2004 |
| JP | 2018-063382 A | 4/2018 |
| WO | 2006/115044 A1 | 11/2006 |
| WO | 2007/066597 A1 | 6/2007 |
| WO | 2008/047638 A1 | 4/2008 |
| WO | 2009/008446 A1 | 1/2009 |
| WO | 2018/016615 A1 | 1/2018 |
| WO | 2018/190380 A1 | 10/2018 |
| WO | 2018/203540 A1 | 11/2018 |
| WO | 2019/031556 A1 | 2/2019 |

OTHER PUBLICATIONS

May 30, 2023 Office Action issued in Taiwanese Patent Application No. 109107932.
May 26, 2020 Search Report issued in International Patent Application No. PCT/JP2020/009438.
May 26, 2020 Written Opinion issued in International Patent Application No. PCT/JP2020/009438.

*Primary Examiner* — Victor A Mandala
*Assistant Examiner* — Colleen E Snow
(74) *Attorney, Agent, or Firm* — Oliff PLC

(57) ABSTRACT

A resist underlayer film-forming composition revealing high reflow properties while applying and heating the composition on a substrate, allowing a flat application on a multi-level substrate thus forming a flat film. The composition includes a copolymer having a repeating structural unit of the following Formula (1) and/or a repeating structural unit of the following Formula (2) and an organic solvent:

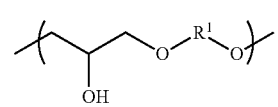

(1)

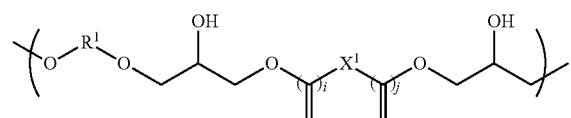

(2)

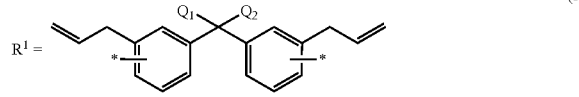

(3)

(in Formulae (1) and (2), $R^1$ is a functional group of Formula (3); in Formula (3), $Q_1$ and $Q_2$ are each independently a hydrogen atom or a $C_{1-5}$ alkyl group, and * is a dangling bond to an oxygen atom; and in Formula (2), $X^1$ is a $C_{1-50}$ organic group, and i and j are each independently 0 or 1).

11 Claims, No Drawings

RESIST UNDERLAYER FILM-FORMING COMPOSITION

TECHNICAL FIELD

The present invention relates to a resist underlayer film-forming composition for forming a planarization film on a multi-level substrate in order to fill stepped portions lying on the substrate so as to achieve flatness, and a method for producing a planarized resist underlayer film using the resist underlayer film-forming composition.

BACKGROUND ART

In recent years, it has been demanded that processing of semiconductor integrated circuit devices needs to be conducted according to detailed design layouts. In order to create still finer resist patterns while using optical lithography technique, exposure wavelengths need to be further shortened.

However, since the depth of focus declines while shortening the exposure wavelengths, the flatness of a coating film formed on a substrate needs to be further advanced. Specifically, for producing semiconductor devices containing detailed design layouts, establishment of a film planarization technique, which enables to form further advanced planarization films particularly on a multi-level substrate, becomes highly important.

Until now, as to methods of forming planarization films, for example, methods for forming a resist underlayer film under a resist film through photocuring have been disclosed.

For examples, there has been disclosed a resist underlayer film-forming composition containing a polymer having an epoxy group or an oxetane group in a side chain and a photo-cationic polymerization initiator, or a resist underlayer film-forming composition containing a polymer having a radical polymerizable ethyleny unsaturated bond and a photo-radical polymerization initiator (see Patent Document 1).

There has also been disclosed a resist underlayer film-forming composition containing a silicon-containing compound having a cationic polymerizable reactive group (e.g., an epoxy group or a vinyl group), a photo-cationic polymerization initiator, and a photo-radical polymerization initiator (see Patent Document 2).

There has also been disclosed a method for producing a semiconductor device using a resist underlayer film containing a polymer having a crosslinkable functional group (e.g., a hydroxy group) in a side chain, a crosslinking agent, and a photoacid generator (see Patent Document 3).

There has also been disclosed a resist underlayer film having an unsaturated bond in a main or side chain, which is not a photo-crosslinked resist underlayer film (see Patent Documents 4 and 5).

PRIOR ART DOCUMENTS

Patent Documents

Patent Document 1: WO 2006/115044
Patent Document 2: WO 2007/066597
Patent Document 3: WO 2008/047638
Patent Document 4: WO 2009/008446
Patent Document 5: JP 2004-533637 A

SUMMARY OF THE INVENTION

Problems to be Solved by the Invention

The use of conventional photo-crosslinkable materials, for example, a resist underlayer film-forming composition containing a polymer having a thermally crosslinkable functional group such as a hydroxy group, a crosslinking agent, and an acid catalyst (acid generator), may pose the following problems. Specifically, when the composition is heated for being filled into irregular patterns (e.g., a hole or a trench structure) formed on a substrate, a crosslinking reaction proceeds, thus leading to increase in viscosity so as to cause insufficient filling into the interior of the pattern on the substrate.

When the conventional resist underlayer film is formed through heating at a temperature of 180° C. or higher, the resist underlayer film-forming composition is gradually thermally cured, causing poor reflow properties.

In general, a resist underlayer film-forming composition, that contains a polymer having a cationic polymerizable reactive group (e.g., an epoxy group or a vinyl group) and an acid generator, is cured through combination of photoirradiation and heating. This thus causes cumbersome processes.

In lithographic processes for producing semiconductor devices, reflection of exposure light coming from a substrate onto a resist layer causes deformed pattern edges that fail to form a resist pattern in a desired shape. This results in not only dimensional alteration to the resist pattern but poor resolution.

Based on the above, an object of the present invention is to provide a resist underlayer film-forming composition for forming a planarization film on a substrate, wherein the composition can achieve sufficient filling onto a pattern, causing no thermal shrinkage, exhibiting favorable reflow properties and forming a cured film with advanced reflection effect.

Means for Solving the Problems

A first aspect of the present invention is a resist underlayer film-forming composition comprising a copolymer having a repeating structural unit of the following Formula (1) and/or a repeating structural unit of the following Formula (2) and an organic solvent:

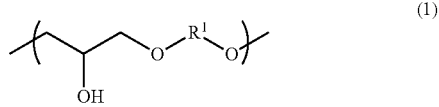

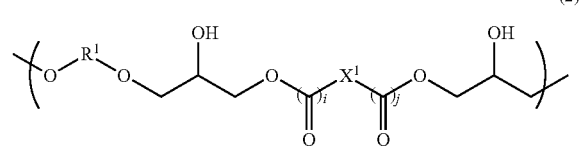

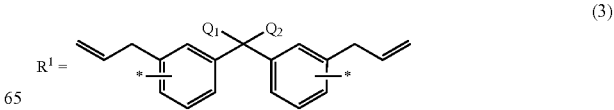

(in Formulae (1) and (2), $R^1$ is a functional group of Formula (3); in Formula (3), $Q_1$ and $Q_2$ are each independently a hydrogen atom or a $C_{1-5}$ alkyl group, and * is a dangling bond to an oxygen atom; and in Formula (2), $X^1$ is a $C_{1-50}$ organic group, and i and j are each independently 0 or 1).

A second aspect of the present invention is the resist underlayer film-forming composition according to the first aspect, wherein the functional group of Formula (3) is a group of the following Formula (4):

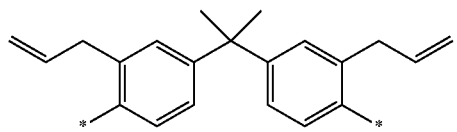

(4)

(wherein * is a dangling bond to an oxygen atom).

A third aspect of the present invention is the resist underlayer film-forming composition according to the first or second aspect, wherein, in the repeating structural unit of Formula (2), $X^1$ is a linear, branched, or cyclic divalent hydrocarbon group having a carbon atom number of 2 to 20, a linear, branched, or cyclic divalent organic group having a carbon atom number of 2 to 20 and at least one sulfur atom or oxygen atom, or a divalent organic group containing at least one $C_{6-20}$ aromatic ring or $C_{3-12}$ heterocyclic ring, and the heterocyclic ring has at least one sulfur atom or oxygen atom.

A fourth aspect of the present invention is the resist underlayer film-forming composition according to any one of the first to third aspects, wherein the copolymer contains a repeating structural unit formed from an $R^1$-containing monomer in an amount of 25% or more.

A fifth aspect of the present invention is the resist underlayer film-forming composition according to any one of the first to fourth aspects, wherein the composition further comprises a photo-crosslinking agent.

A sixth aspect of the present invention is the resist underlayer film-forming composition according to any one of the first to fifth aspects, wherein the composition further comprises a compound of the following Formula (5) and/or a compound of the following Formula (6):

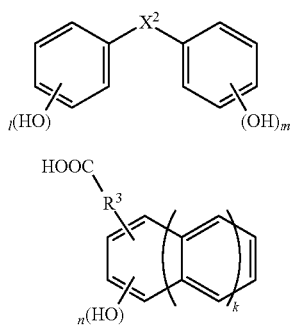

(wherein $X^2$ is a carbonyl group or a methylene group; l and m are each independently an integer of 0 to 5 and satisfy a relation of $3 \leq l+m \leq 10$; $R^3$ is a $C_{1-4}$ alkylene group or alkenylene group or a single bond; k is 0 or 1; and n is an integer of 2 to 4).

A seventh aspect of the present invention is the resist underlayer film-forming composition according to any one of the first to sixth aspects, wherein the composition further comprises a surfactant.

An eighth aspect of the present invention is a method for producing a resist underlayer film, the method comprising a step of applying the resist underlayer film-forming composition according to any one of the first to seventh aspects to a multi-level substrate; and a heating step of thermally curing the composition.

A ninth aspect of the present invention is the method for producing a resist underlayer film according to the eighth aspect, wherein the heating temperature in the heating step is 200° C. to 300° C.

A tenth aspect of the present invention is the method for producing a resist underlayer film according to the ninth aspect, wherein the method further comprises a light exposure step.

An eleventh aspect of the present invention is a method for producing a resist underlayer film without a light exposure step, the method comprising a step of applying the resist underlayer film-forming composition according to any one of the first to seventh aspects to a multi-level substrate; and a heating step of thermally curing the composition at 250° C. or higher.

Effects of the Invention

The resist underlayer film-forming composition of the present invention exhibits high reflow properties through application of the composition to a substrate and then a step of heating the composition. Thus, the resist underlayer film-forming composition can form a flat film even on a multi-level substrate. The thus-formed cured film exhibits an appropriate antireflection effect.

When the resist underlayer film-forming composition of the present invention contains a surfactant, the composition effectively exhibits improved applicability to a substrate.

According to the method for producing a resist underlayer film of the present invention, the resist underlayer film-forming composition of the present invention is applied to a substrate, and then the composition is heated. This heating step leads to high reflow properties of the composition. Thus, the composition can form a flat film even on a multi-level substrate. The thus-formed cured film exhibits an appropriate antireflection effect.

According to the method for producing a resist underlayer film of the present invention, the resist underlayer film-forming composition of the present invention can be cured by combination of two steps; i.e., a heating step and a light exposure step. Meanwhile, the resist underlayer film-forming composition of the present invention can be cured only by heating at a high temperature without undergoing the light exposure step, to thereby form a planarization film having planarity. Thus, the production process is simplified, and the work efficiency is effectively improved.

MODES FOR CARRYING OUT THE INVENTION

<Copolymer>

The resist underlayer film-forming composition of the present invention contains a copolymer as an essential component. Preferably, the copolymer has a repeating structural unit of the following Formula (1) and/or a repeating structural unit of the following Formula (2).

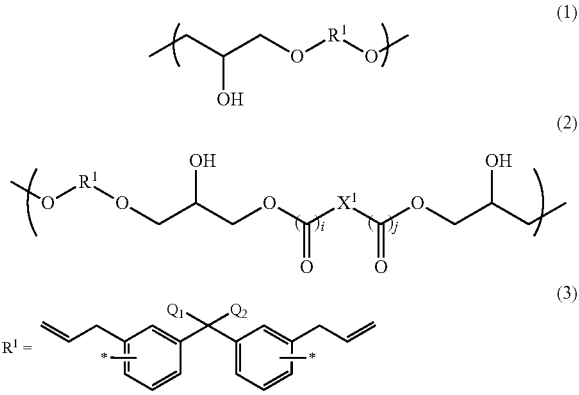

(In Formulae (1) and (2), $R^1$ is a functional group of Formula (3); in Formula (3), $Q_1$ and $Q_2$ are each independently a hydrogen atom or a $C_{1-5}$ alkyl group, and * is a dangling bond to an oxygen atom; and in Formula (2), $X^1$ is a $C_{1-50}$ organic group, and i and j are each independently 0 or 1.)

Preferably, $Q_1$ and $Q_2$ in Formula (3) are each independently a hydrogen atom. Thus, the functional group of Formula (3) is preferably a group of the following Formula (4).

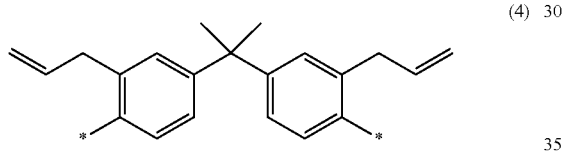

(In Formula (4), * is a dangling bond to an oxygen atom.)

The copolymer contains a repeating structural unit formed from an $R^1$-containing monomer in an amount of preferably 25% or more, more preferably 50% or more.

Preferably, $X^1$ in Formula (2) is a linear, branched, or cyclic divalent hydrocarbon group having a carbon atom number of 2 to 20, a linear, branched, or cyclic divalent organic group having a carbon atom number of 2 to 20 and at least one sulfur atom or oxygen atom, or a divalent organic group containing at least one $C_{6-20}$ aromatic ring or $C_{3-12}$ heterocyclic ring, and the heterocyclic ring has at least one sulfur atom or oxygen atom.

Examples of the aforementioned aromatic ring include a benzene ring, a naphthalene ring, an anthracene ring, a phenanthrene ring, a naphthacene ring, a triphenylene ring, a pyrene ring, and a chrysene ring. Preferred are a benzene ring and a naphthalene ring.

Examples of the aforementioned heterocyclic ring include a triazine ring, a cyanuric ring, a pyrimidine ring, an imidazole ring, and a carbazole ring.

Compounds of the following Formulae are examples of the monomer corresponding to the repeating unit of Formula (1) in the aforementioned copolymer.

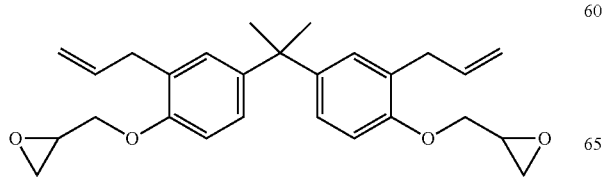

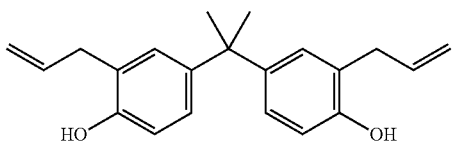

Compounds of the following Formulae are examples of the monomer corresponding to the repeating unit of Formula (2) in the aforementioned copolymer.

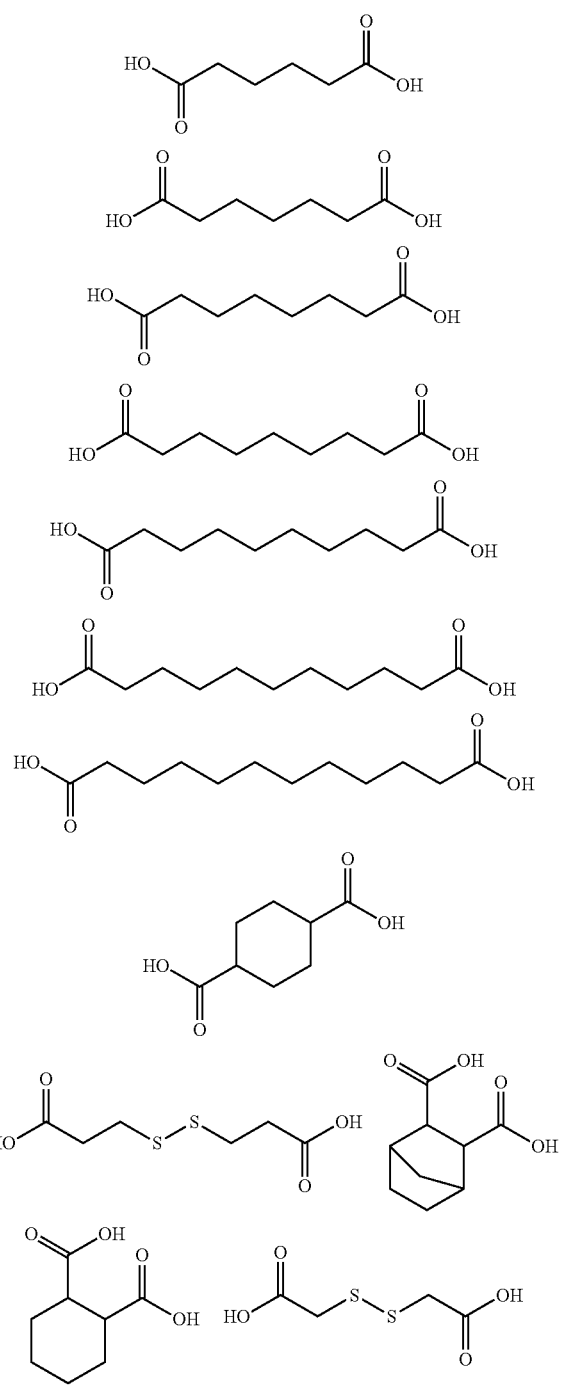

-continued
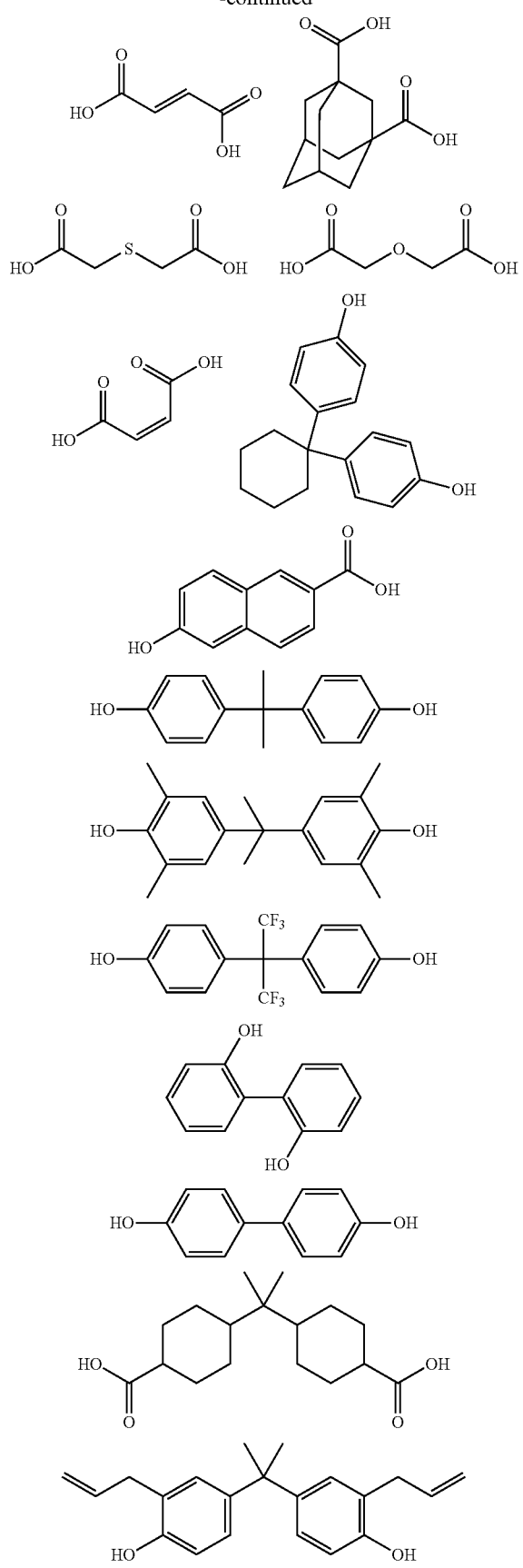
-continued
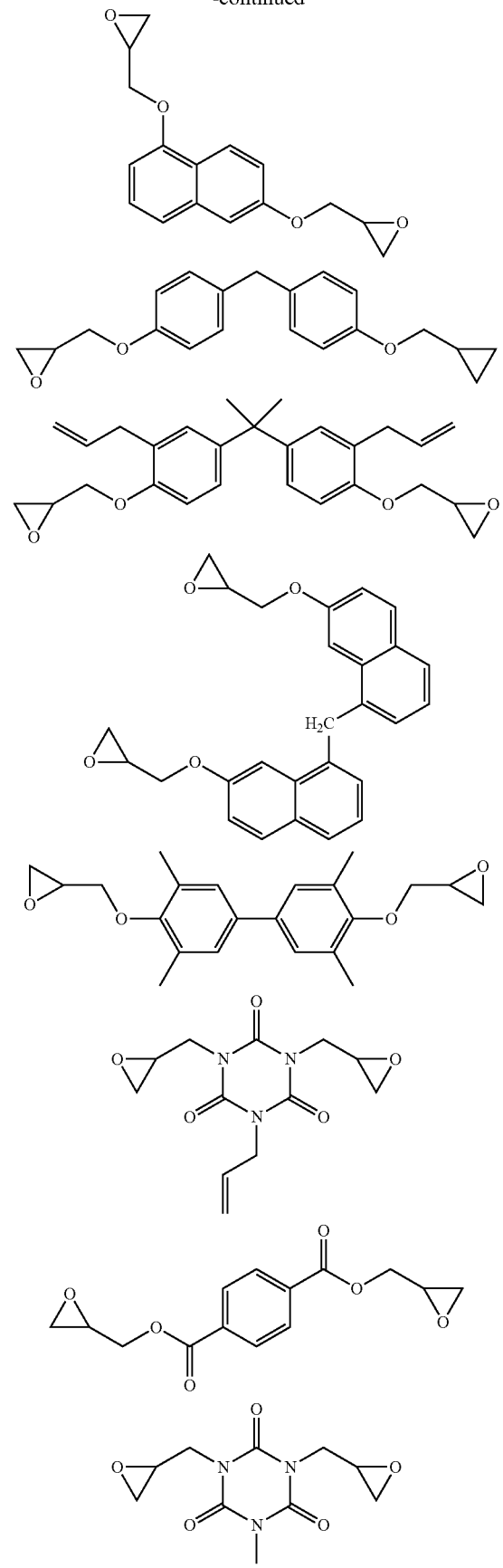

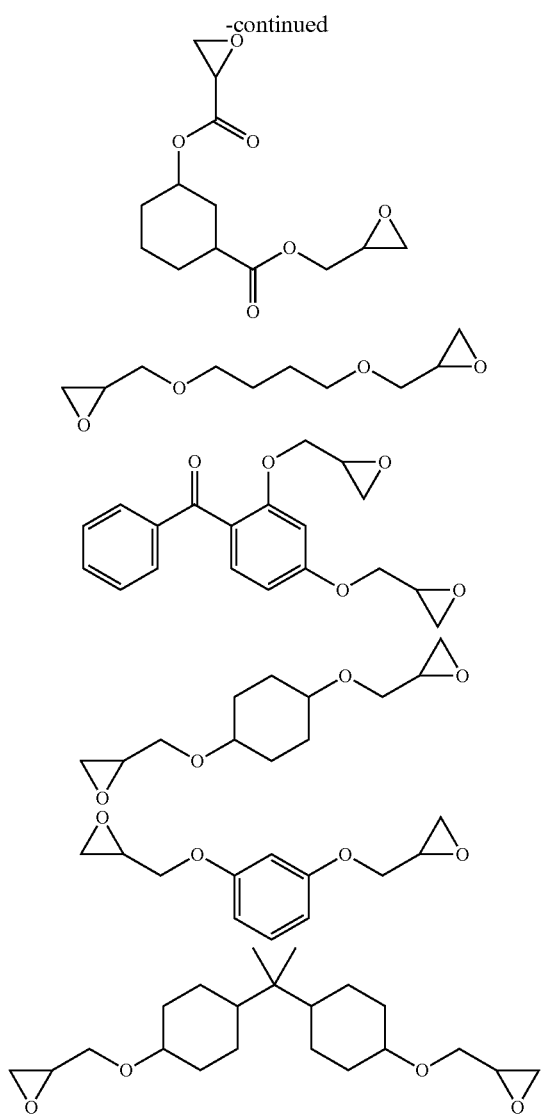
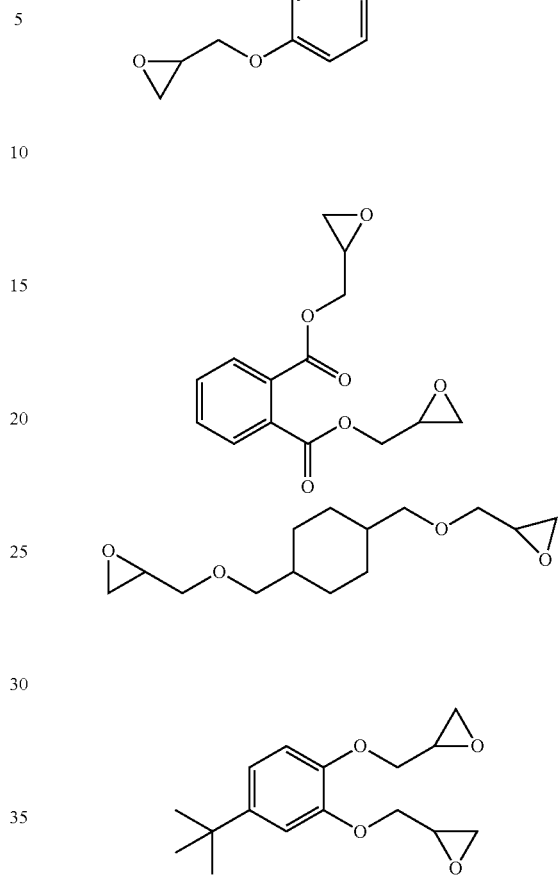
Examples of the copolymer having the repeating structural unit of Formula (1) and the repeating structural unit of Formula (2) include copolymers having repeating structural units of the following Formulae (1a) to (1k).
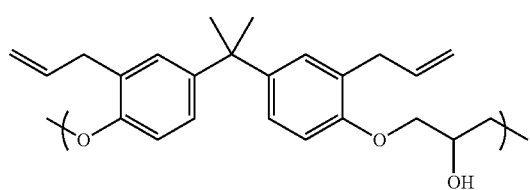
(1a)
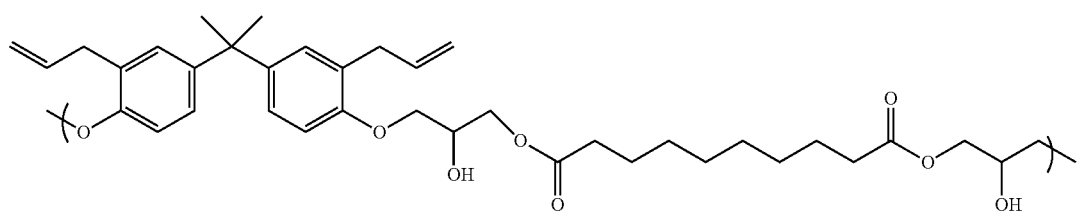
(1b)

-continued
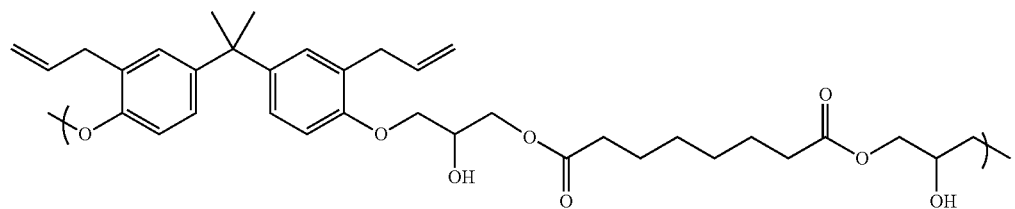
(1c)
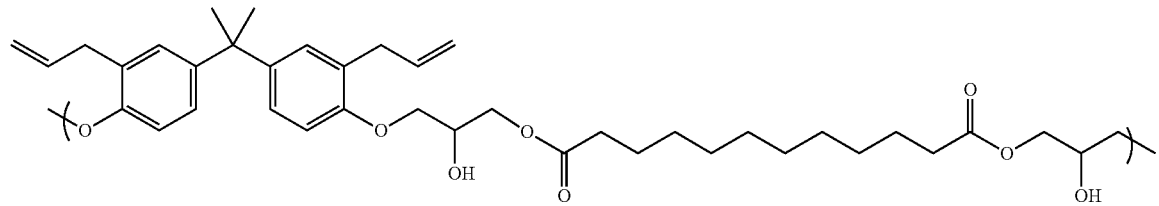
(1d)
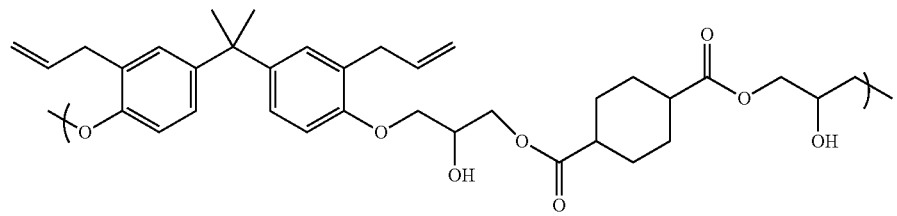
(1e)
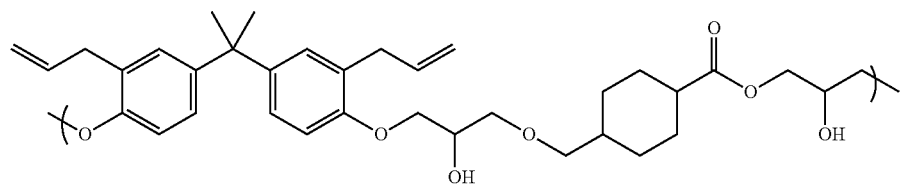
(1f)
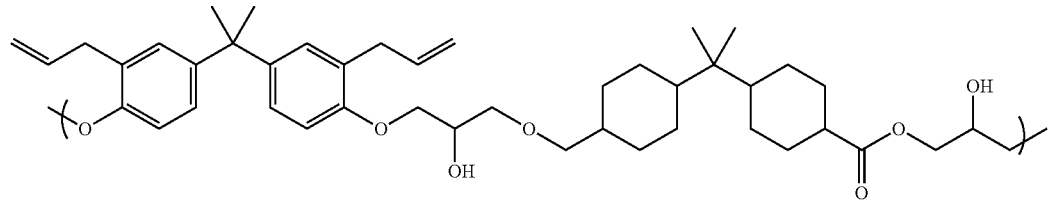
(1g)
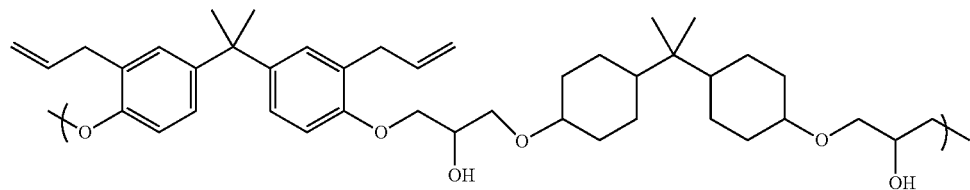
(1h)
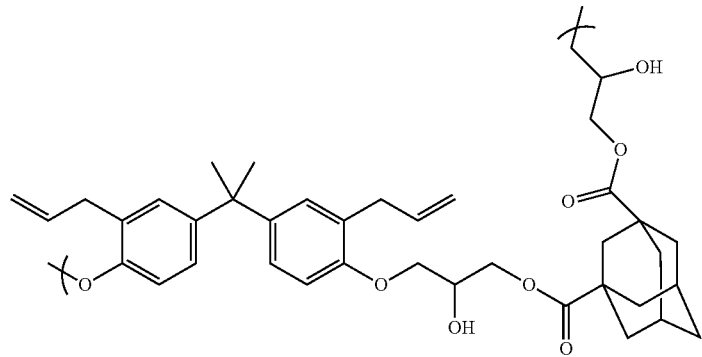
(1i)

-continued

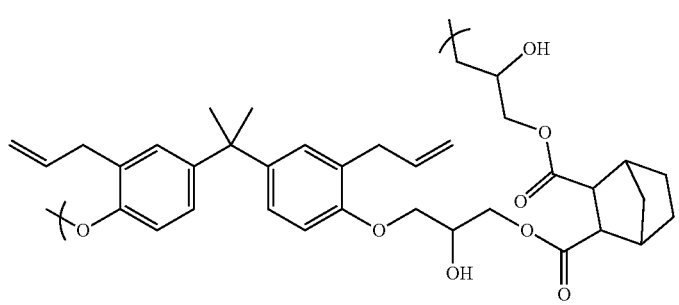
(1j)

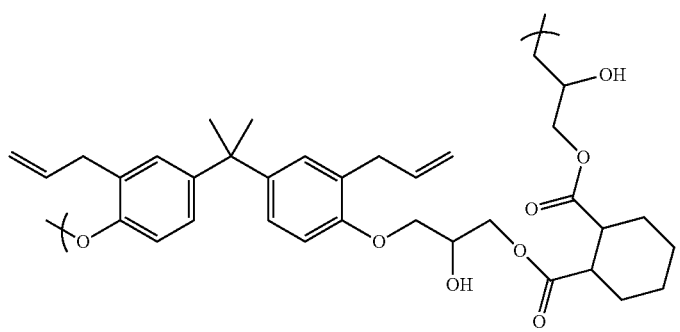
(1k)

The resist underlayer film-forming composition of the present invention may contain, as an optional component, a compound of the following Formula (5) and/or a compound of the following Formula (6).

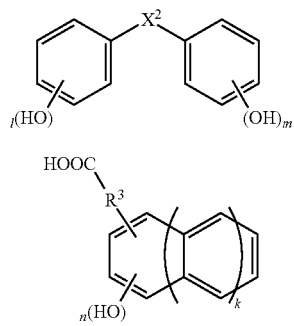
(5)

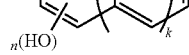

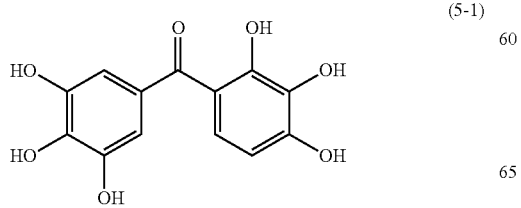
(6)

(In these Formulae, $X^2$ is a carbonyl group or a methylene group; l and m are each independently an integer of 0 to 5 and satisfy a relation of $3 \leq l+m \leq 10$; $R^3$ is a $C_{1-4}$ alkylene group or alkenylene group or a single bond; k is 0 or 1; and n is an integer of 2 to 4.)

Examples of the compound of Formula (5) include compounds of the following Formulae (5-1) to (5-20).

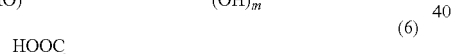
(5-1)

-continued

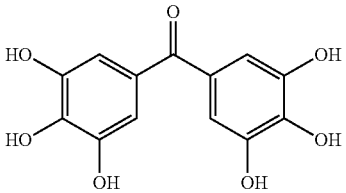
(5-2)

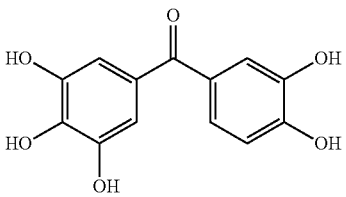
(5-3)

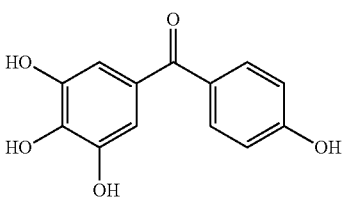
(5-4)

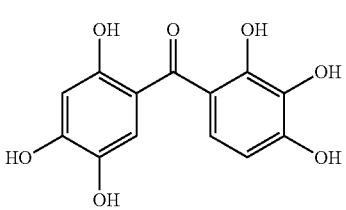
(5-5)

(5-6)
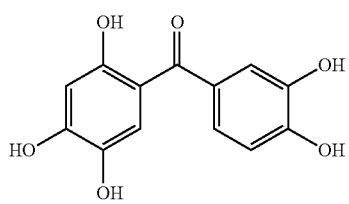
(5-7)
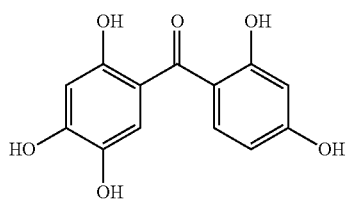
(5-8)
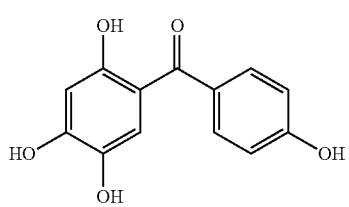
(5-9)
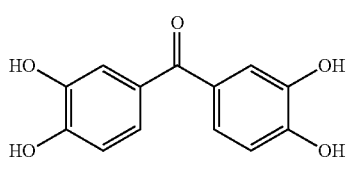
(5-10)
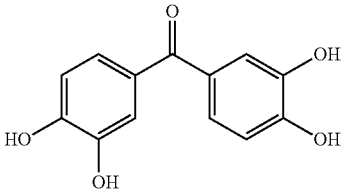
(5-11)
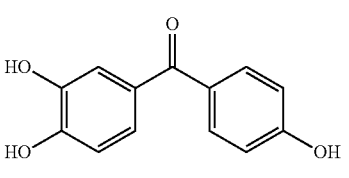
(5-12)
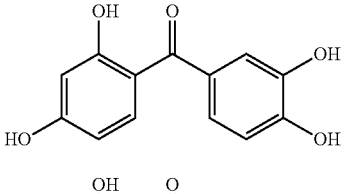
(5-13)
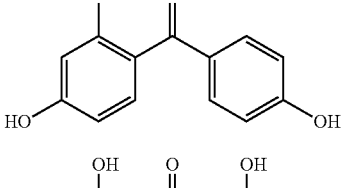
(5-14)
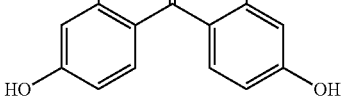
(5-15)
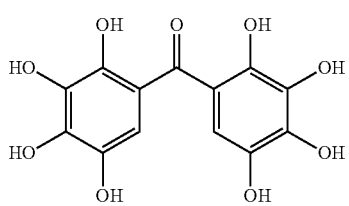
(5-16)
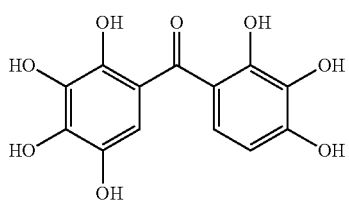
(5-17)
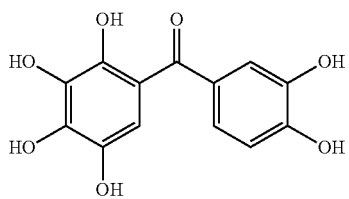
(5-18)
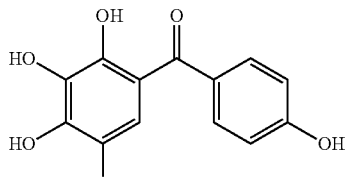
(5-19)
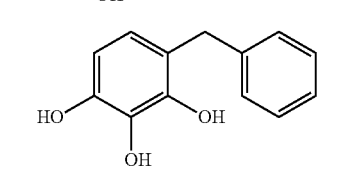
(5-20)
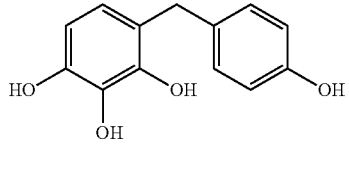
Examples of the compound of Formula (6) include compounds of the following Formulae (6-1) to (6-31).
(6-1)
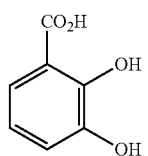
(6-2)
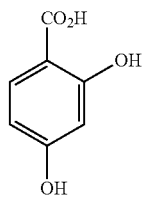

-continued
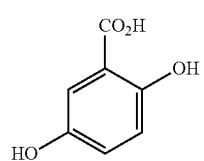
(6-3)
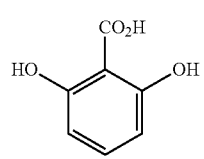
(6-4)
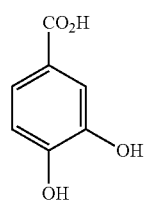
(6-5)
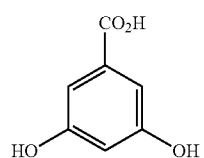
(6-6)
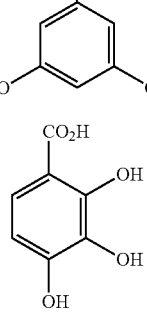
(6-7)
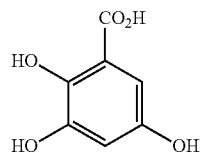
(6-8)
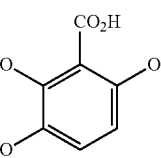
(6-9)
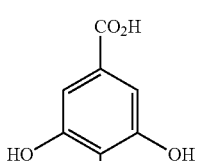
(6-10)
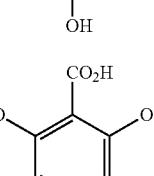
(6-11)
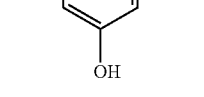
-continued
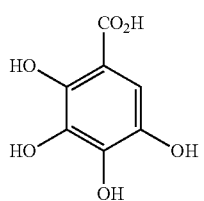
(6-12)
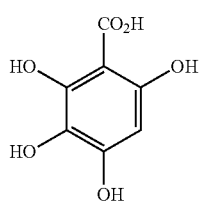
(6-13)
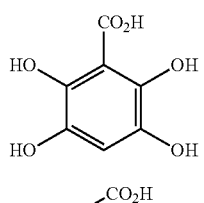
(6-14)
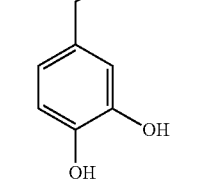
(6-15)
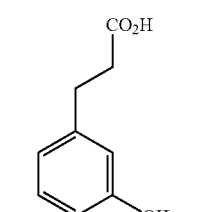
(6-16)
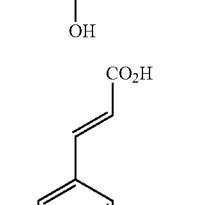
(6-17)
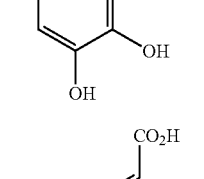
(6-18)
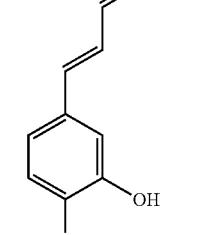

(6-19) 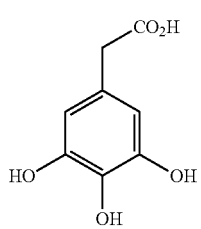

(6-20) 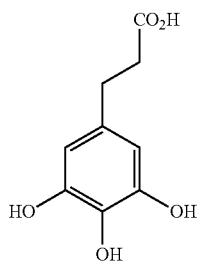

(6-21) 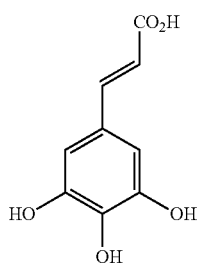

(6-22) 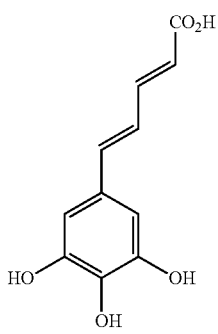

(6-23) 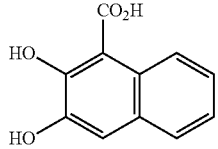

(6-24) 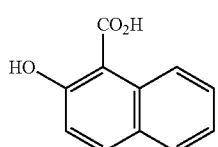

(6-25) 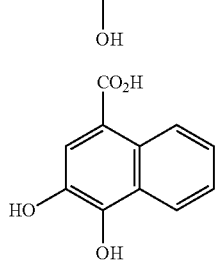

(6-26) 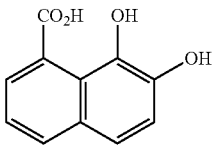

(6-27) 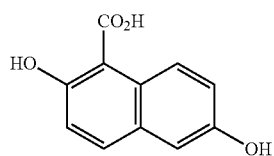

(6-28) 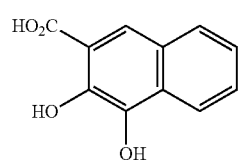

(6-29) 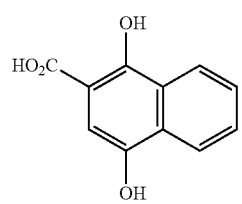

(6-30) 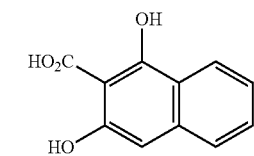

(6-31) 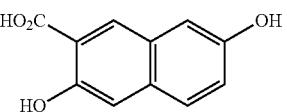

The resist underlayer film-forming composition of the present invention contains the compound of Formula (5) and/or the compound of Formula (6) in an amount of, for example, 0.01 parts by mass to 60 parts by mass, preferably 0.1 parts by mass to 20 parts by mass, relative to 100 parts by mass of the amount of the aforementioned copolymer.

<Photo-Crosslinking Agent>

The resist underlayer film-forming composition of the present invention does not require a thermal crosslinking agent. The resist underlayer film-forming composition may optionally contain a photo-crosslinking agent.

Examples of the photo-crosslinking agent include a glycidyl ether compound, a glycidyl ester compound, a glycidyl-group-containing isocyanurate, an epoxycyclohexyl compound, an epoxy-group-substituted cyclohexyl compound, and resins of these compounds. Examples of the photo-crosslinking agent usable in the present invention are described below.

Formula (C-1)
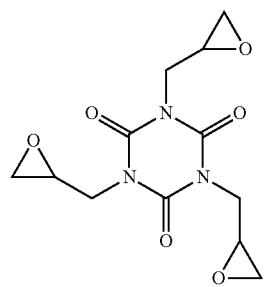
Formula (C-2)
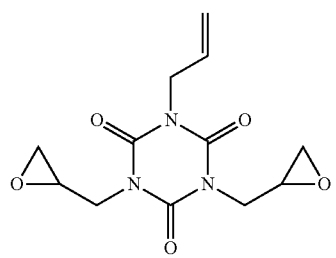
Formula (C-3)
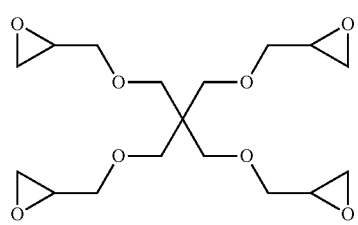
(Formula C-4)
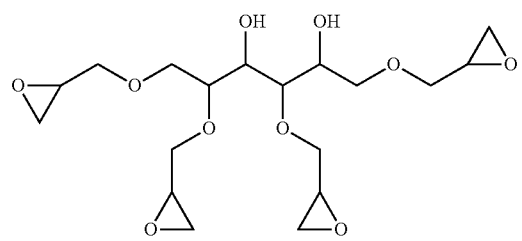
(Formula C-5)
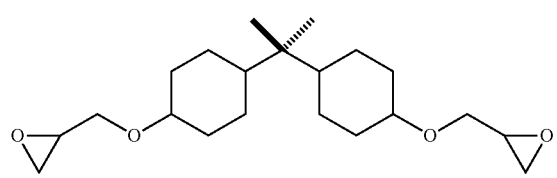
(Formula C-6)
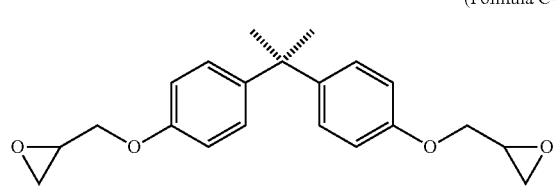
Formula (C-7)
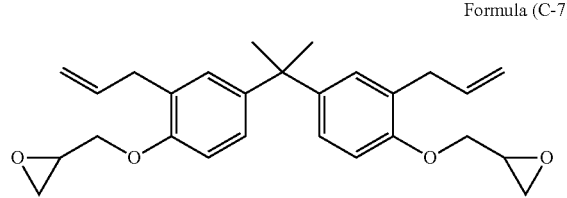
-continued
Formula (C-8)
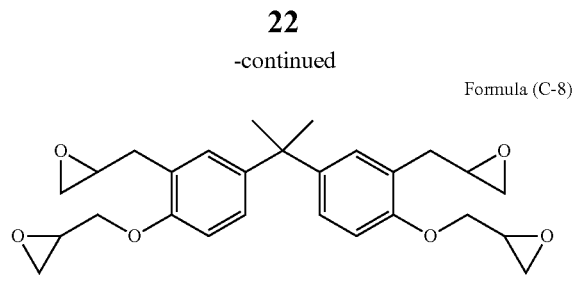
Formula (C-9)
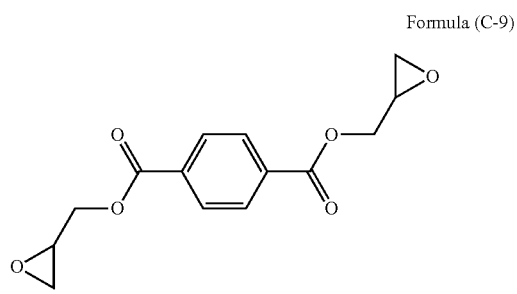
Formula (C-10)
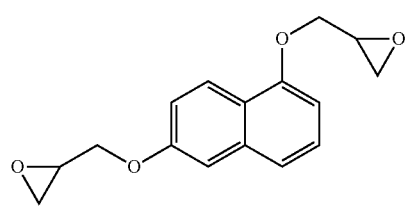
Formula (C-11)
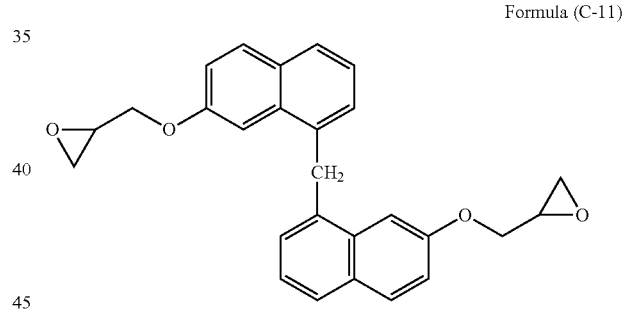
Formula (C-12)
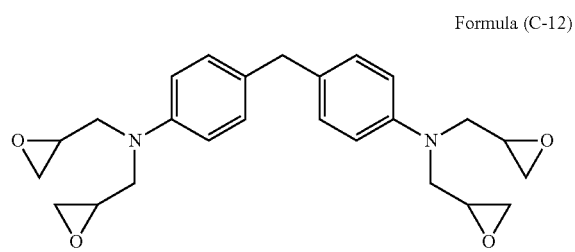
Formula (C-13)
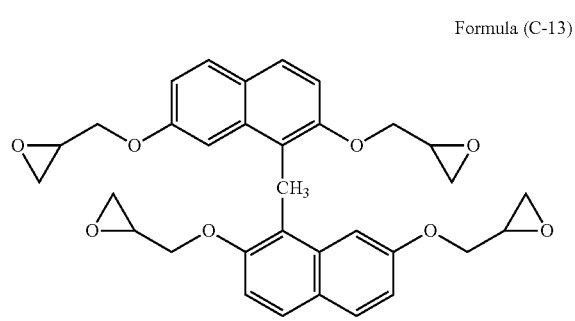

Formula (C-14)
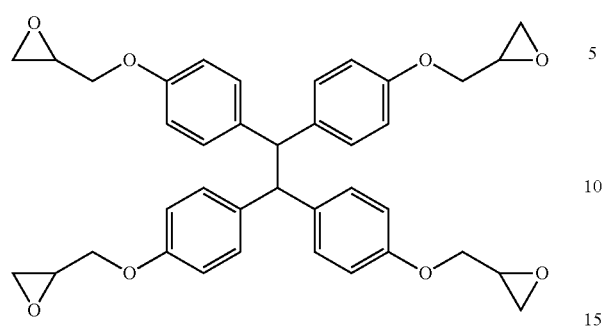
Formula (C-15)
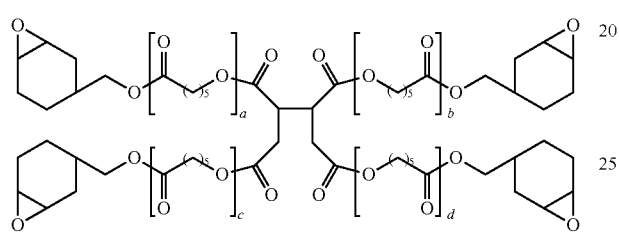
Formula (C-16)
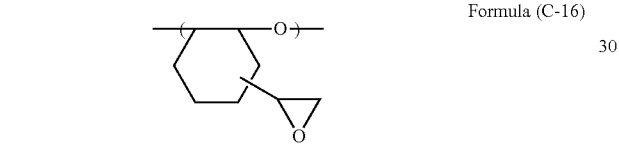
Formula (C-17)
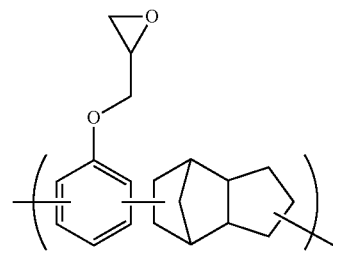
Formula (C-18)
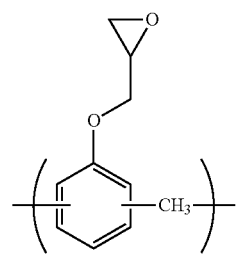
Formula (C-19)
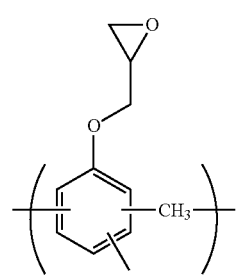
Formula (C-20)
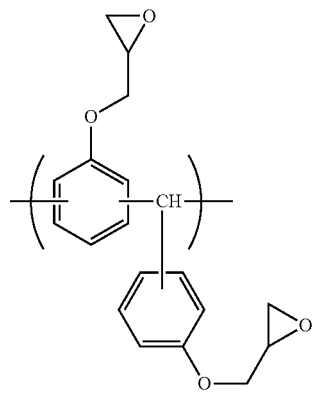
Formula (C-21)
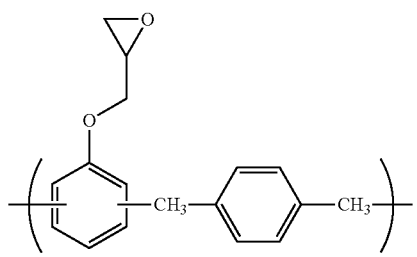
Formula (C-22)
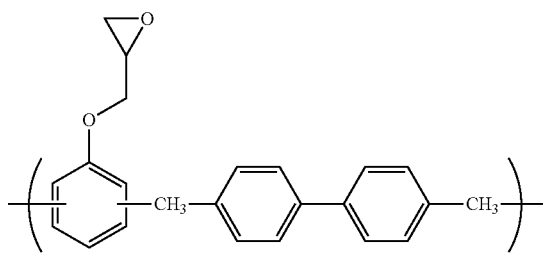
Formula (C-23)
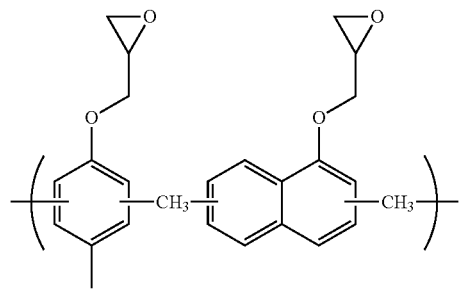
Formula (C-24)
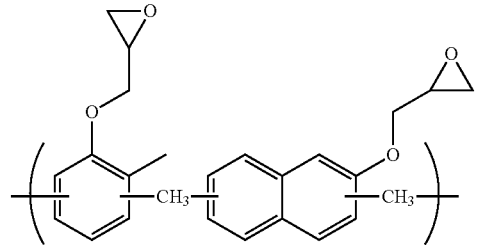

Formula (C-25)
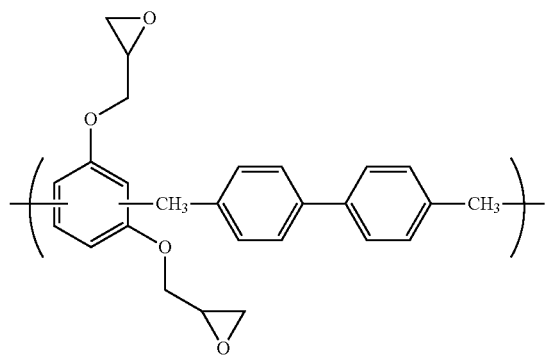

Formula (C-26)
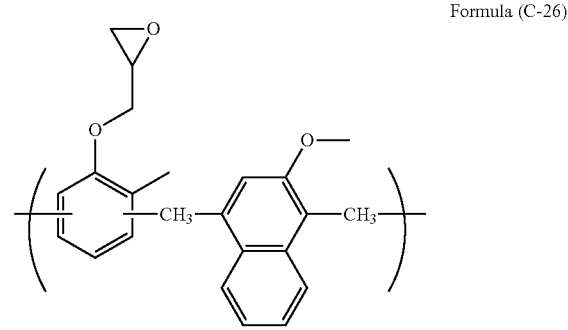

Formula (C-27)
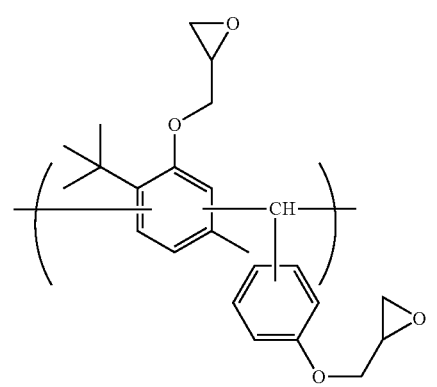

Formula (C-28)
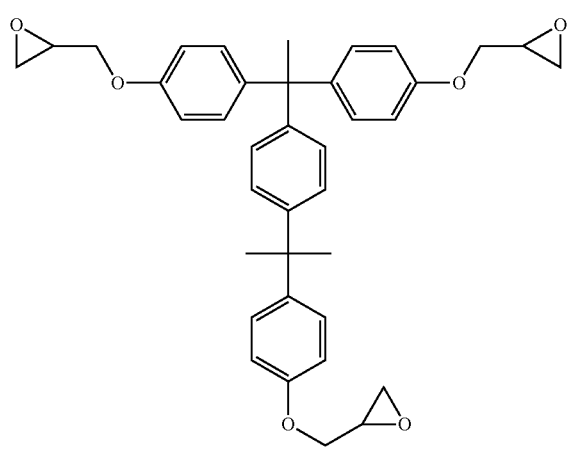

The compound of Formula (C-1) can be obtained as trade name TEPIC-SS available from Nissan Chemical Corporation.

The compound of Formula (C-2) can be obtained as trade name MA-DGIC available from SHIKOKU CHEMICALS CORPORATION.

The compound of Formula (C-3) can be obtained as trade name EX-411 available from Nagase ChemteX Corporation.

The compound of Formula (C-4) can be obtained as trade name EX-521 available from Nagase ChemteX Corporation.

The compound of Formula (C-7) can be obtained as trade name RE-810NM available from Nippon Kayaku Co., Ltd.

The compound of Formula (C-8) can be obtained as trade name BATG available from Showa Denko K.K.

The compound of Formula (C-9) can be obtained as trade name EX-711 available from Nagase ChemteX Corporation.

The compound of Formula (C-10) can be obtained as trade name YD-4032D available from DIC Corporation.

The compound of Formula (C-11) can be obtained as trade name HP-4770 available from DIC Corporation.

The compound of Formula (C-12) can be obtained as trade name YH-434L available from Nippon Steel & Sumikin Chemical Co., Ltd.

The compound of Formula (C-13) can be obtained as trade name EPICLON HP-4700 available from DIC Corporation.

The compound of Formula (C-14) can be obtained as trade name TEP-G available from ASAHI YUKIZAI CORPORATION.

The compound of Formula (C-15) is trade name Epoleed GT401 available from Daicel Corporation. In Formula (C-15), a, b, c, and d are each 0 or 1, and a+b+c+d is 1.

The compound of Formula (C-16) can be obtained as trade name EHPE-3150 available from Daicel Corporation.

The compound of Formula (C-17) can be obtained as trade name HP-7200L available from DIC Corporation.

The compound of Formula (C-18) can be obtained as trade name EPPN-201 available from Nippon Kayaku Co., Ltd.

The compound of Formula (C-19) can be obtained as trade name ECN-1229 available from Asahi Kasei Epoxy Co., Ltd.

The compound of Formula (C-20) can be obtained as trade name EPPN-501H available from Nippon Kayaku Co., Ltd.

The compound of Formula (C-21) can be obtained as trade name NC-2000L available from Nippon Kayaku Co., Ltd.

The compound of Formula (C-22) can be obtained as trade name NC-3000L available from Nippon Kayaku Co., Ltd.

The compound of Formula (C-23) can be obtained as trade name NC-7000L available from Nippon Kayaku Co., Ltd.

The compound of Formula (C-24) can be obtained as trade name NC-7300L available from Nippon Kayaku Co., Ltd.

The compound of Formula (C-25) can be obtained as trade name NC-3500 available from Nippon Kayaku Co., Ltd.

The compound of Formula (C-26) can be obtained as trade name EPICLON HP-5000 available from DIC Corporation.

The compound of Formula (C-27) can be obtained as trade name FAE-2500 available from Nippon Kayaku Co., Ltd.

The compound of Formula (C-28) can be obtained as trade name NC-6000 available from Nippon Kayaku Co., Ltd.

<Surfactant>

The resist underlayer film-forming composition of the present invention may contain, as an optional component, a surfactant for improving the applicability of the composition to a substrate. Examples of the surfactant include nonionic surfactants, for example, polyoxyethylene alkyl ethers, such as polyoxyethylene lauryl ether, polyoxyethylene stearyl ether, polyoxyethylene cetyl ether, and polyoxyethylene oleyl ether, polyoxyethylene alkylaryl ethers, such as polyoxyethylene octylphenyl ether and polyoxyethylene nonylphenyl ether, polyoxyethylene-polyoxypropylene block copolymers, sorbitan fatty acid esters, such as sorbitan monolaurate, sorbitan monopalmitate, sorbitan monostearate, sorbitan monooleate, sorbitan trioleate, and sorbitan tristearate, and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-containing surfactants, such as EFTOP [registered trademark] EF301, EF303, and EF352 (available from Mitsubishi Materials Electronic Chemicals Co., Ltd.), MEGAFAC [registered trademark] F171, F173, R30, R-30N, and R-40-LM (available from DIC Corporation), Fluorad FC430 and FC431 (available from 3M Japan Limited), Asahi Guard [registered trademark] AG710, and SURFLON [registered trademark] S-382, SC101, SC102, SC103, SC104, SC105, and SC106 (available from AGC Inc.); and Organosiloxane Polymer KP341 (available from Shin-Etsu Chemical Co., Ltd.). These surfactants may be added singly or in combination of two or more species.

In the case of use of the aforementioned surfactant, the amount of the surfactant is, for example, 0.01 parts by mass to 5 parts by mass, preferably 0.1 parts by mass to 3 parts by mass, relative to 100 parts by mass of the amount of the aforementioned copolymer.

<Organic Solvent>

The resist underlayer film-forming composition of the present invention can be prepared by dissolving the aforementioned components in an appropriate organic solvent, and the composition is used in the form of a homogenous solution. Examples of such a solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropinoate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, and N-methylpyrrolidone. These organic solvents may be used singly or in combination of two or more species. Such an organic solvent may be mixed with a high-boiling-point organic solvent such as propylene glycol monobutyl ether or propylene glycol monobutyl ether acetate.

<Production Method for Resist Underlayer Film>

Next will be described a method for producing a resist underlayer film from the resist underlayer film-forming composition of the present invention. Specifically, the resist underlayer film-forming composition is applied onto a substrate used for the production of a precise integrated circuit element (e.g., a transparent substrate, such as a silicon/silicon dioxide coating, a glass substrate, or an ITO substrate) by an appropriate coating method using, for example, a spinner or a coater. Thereafter, the composition is baked (heated) on a hot plate, to thereby form a resist underlayer film. Thus, the resist underlayer film production method includes a step of applying the resist underlayer film-forming composition to a substrate, and a heating step of heating the composition at a high temperature.

The resist underlayer film-forming composition of the present invention is not thermally cured even at a high temperature up to 250° C., and the resist underlayer film-forming composition is thermally cured through heating at a high temperature of 250° C. or higher, to thereby form a flat resist underlayer film.

In the present invention, the heating temperature in the heating step is preferably 200° C. to 300° C.

In the case of heating at a high temperature of 250° C. or higher, the resist underlayer film-forming composition is thermally cured, and a resist underlayer film can be formed without undergoing a light exposure step.

In the method of the present invention, the underlayer film-forming composition, which is not thermally cured in the heating step, is heated and then subjected to a light exposure step (i.e., irradiated with ultraviolet rays by using an ultraviolet irradiation apparatus), to thereby photo-cure the resist underlayer film-forming composition.

The exposure light used is actinic rays, such as near-ultraviolet rays, far-ultraviolet rays, or extreme-ultraviolet rays (e.g., EUV, wavelength: 13.5 nm); for example, light having a wavelength of 248 nm (KrF laser beam), 193 nm (ArF laser beam), 172 nm (xenon excimer light), or 157 nm (F2 laser beam). Ultraviolet light having a wavelength of 150 nm to 248 nm can be used for light exposure, and light having a wavelength of 172 nm is preferably used.

This light exposure causes crosslinking of the resist underlayer film. The exposure dose in the light exposure step may be 10 mJ/cm$^2$ to 3,000 mJ/cm$^2$. An exposure dose falling within this range causes photoreaction to form a crosslinkage, resulting in solvent resistance.

EXAMPLES

The resist underlayer film-forming composition of the present invention will next be described in detail by way of the following Examples. However, the present invention should not be construed as being limited to the Examples.

The following apparatus, etc. were used for measurement of the weight average molecular weights of reaction products prepared in Synthesis Examples described below.

Apparatus: HLC-8320GPC, available from TOSOH CORPORATION
GPC column: TSKgel Super-Multipore HZ-N (two columns)
Column temperature: 40° C.
Flow rate: 0.35 mL/minute
Eluent: THF
Standard sample: polystyrene Abbreviations used in the Examples have the following meanings.

PGME: propylene glycol monomethyl ether
RE810-NM: diallylbisphenol A type epoxy resin (the following Formula (A))
BPA-CA: 2,2-bis(3-allyl-4-hydroxyphenyl)propane (the following Formula (B))

Ex-216L: cyclohexanedimethanol diglycidyl ether (the following Formula (C))
Ex-252: hydrogenated bisphenol A diglycidyl ether (the following Formula (D))
Cis-1,2-Cyclohexanedicarboxylic Acid: cis-1,2-cyclohexanedicarboxylic acid
PGMEA: propylene glycol monomethyl ether acetate
EHPE-3150: 2,2-bis(hydroxymethyl)-1-butanol 1,2-epoxy-4-(2-oxiranyl)cyclohexane Adduct

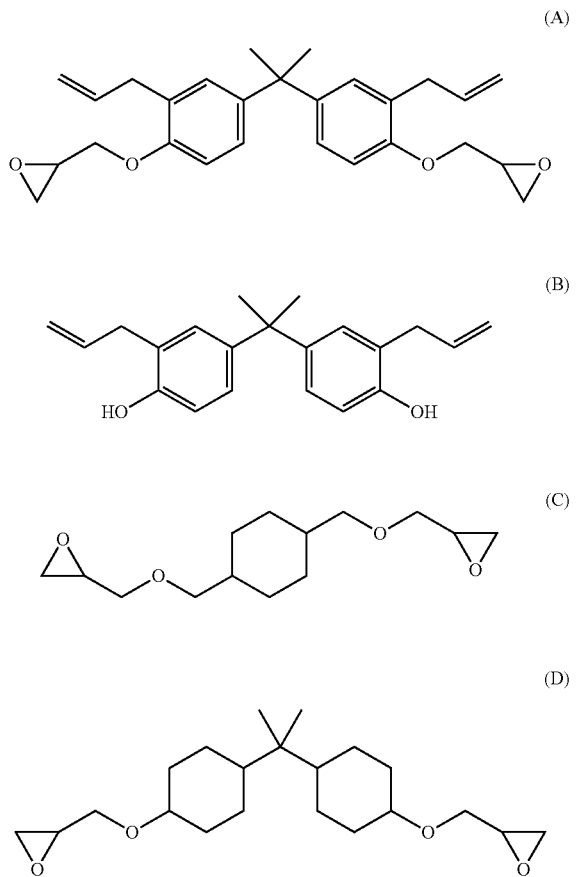

Synthesis Example 1

To 72.46 g of PGME were added 26.00 g of trade name RE810-NM (available from Nippon Kayaku Co., Ltd.), 20.81 g of trade name BPA-CA (available from Konishi Chemical Ind. Co., Ltd.), 2.18 g of ethyltriphenylphosphonium bromide serving as a catalyst, and 0.32 g of hydroquinone serving as a radical trapping agent, and then reaction was allowed to proceed at 140° C. for 24 hours, to thereby prepare a solution containing a reaction product. The solution was diluted with PGME to a 20 wt % solution, and then 147.90 g of an anion exchange resin (product name: DOWEX [registered trademark] MONOSPHERE [registered trademark] 550A, available from MUROMACHI TECHNOS CO., LTD.) and 147.90 g of a cation exchange resin (product name: Amberlyst [registered trademark] 15JWET, available from ORGANO CORPORATION) were added to the solution. The resultant mixture was stirred at 60° C. for four hours and then filtered.

The resultant reaction product was subjected to GPC analysis, and the product was found to have a weight average molecular weight of 18,000 in terms of standard polystyrene. The reaction product is assumed to be a copolymer having a structural unit of the following Formula (7).

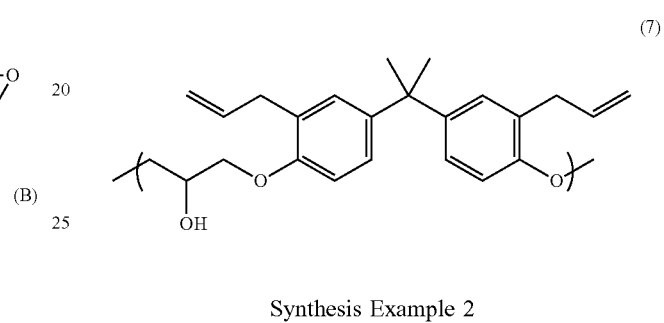

Synthesis Example 2

To 48.10 g of PGME were added 9.00 g of trade name RE810-NM (available from Nippon Kayaku Co., Ltd.), 14.98 g of trade name BPA-CA (available from Konishi Chemical Ind. Co., Ltd.), 6.28 g of trade name Ex-216L (available from Nagase ChemteX Corporation), 1.57 g of ethyltriphenylphosphonium bromide serving as a catalyst, and 0.23 g of hydroquinone serving as a radical trapping agent, and then reaction was allowed to proceed at 140° C. for 24 hours, to thereby prepare a solution containing a reaction product. The solution was subjected to reprecipitation with 320 g of methanol (available from KANTO CHEMICAL CO., INC.). The resultant precipitate was filtered and dried with a reduced pressure dryer at 60° C. for 24 hours, to thereby yield a polymer of interest. The polymer was prepared into a 20 wt % solution with PGME, and then 11.83 g of an anion exchange resin (product name: DOWEX [registered trademark] MONOSPHERE [registered trademark] 550A, available from MUROMACHI TECHNOS CO., LTD.) and 11.81 g of a cation exchange resin (product name: Amberlyst [registered trademark] 15JWET, available from ORGANO CORPORATION) were added to the solution. The resultant mixture was stirred at 25° C. to 30° C. for four hours and then filtered.

The resultant reaction product was subjected to GPC analysis, and the product was found to have a weight average molecular weight of 13,700 in terms of standard polystyrene. The reaction product is assumed to be a copolymer having structural units of the following Formula (8).

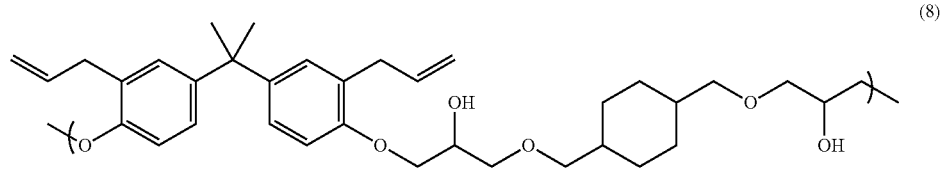

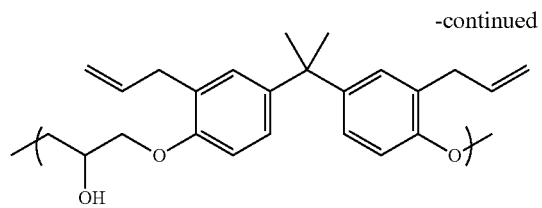

Synthesis Example 3

To 48.10 g of PGME were added 9.00 g of trade name RE810-NM (available from Nippon Kayaku Co., Ltd.), 14.98 g of trade name BPA-CA (available from Konishi Chemical Ind. Co., Ltd.), 8.76 g of trade name Ex-252 (available from Nagase ChemteX Corporation), 1.57 g of ethyltriphenylphosphonium bromide serving as a catalyst, and 0.23 g of hydroquinone serving as a radical trapping agent, and then reaction was allowed to proceed at 140° C. for 24 hours, to thereby prepare a solution containing a reaction product. The solution was subjected to reprecipitation with 320 g of methanol (available from KANTO CHEMICAL CO., INC.). The resultant precipitate was filtered and dried with a reduced pressure dryer at 60° C. for 24 hours, to thereby yield a polymer of interest. The polymer was prepared into a 20 wt % solution with PGME, and then 15.03 g of an anion exchange resin (product name: DOWEX [registered trademark] MONOSPHERE [registered trademark] 550A, available from MUROMACHI TECHNOS CO., LTD.) and 15.16 g of a cation exchange resin (product name: Amberlyst [registered trademark] ISM/ET, available from ORGANO CORPORATION) were added to the solution. The resultant mixture was stirred at 25° C. to 30° C. for four hours and then filtered.

The resultant reaction product was subjected to GPC analysis, and the product was found to have a weight average molecular weight of 11,300 in terms of standard polystyrene. The reaction product is assumed to be a copolymer having structural units of the following Formula (9).

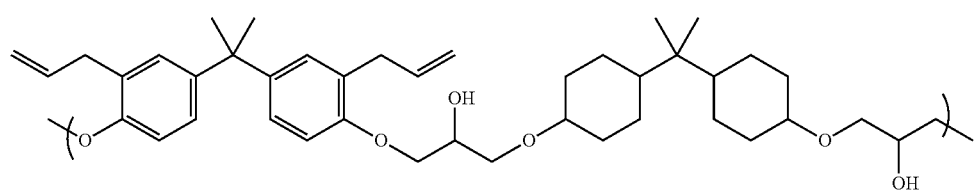

(9)

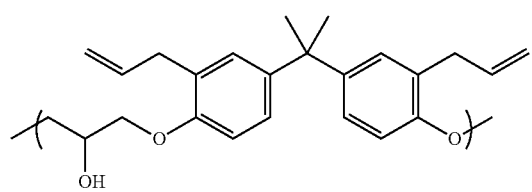

Comparative Synthesis Example 1

To 148.30 g of PGME were added 40.00 g of trade name YX4000 (available from Mitsubishi Chemical Holdings Corporation), 19.54 g of Cis-1,2-Cyclohexanedicarboxylic Acid (available from Tokyo Chemical Industry Co., Ltd.), and 4.01 g of ethyltriphenylphosphonium bromide serving as a catalyst, and then reaction was allowed to proceed at 140° C. for 24 hours, to thereby prepare a solution containing a reaction product. To the solution were added 64.00 g of an anion exchange resin (product name: DOWEX [registered trademark] MONOSPHERE [registered trademark] 550A, available from MUROMACHI TECHNOS CO., LTD.) and 64.00 g of a cation exchange resin (product name: Amberlyst [registered trademark] 15JWET, available from ORGANO CORPORATION), and the resultant mixture was stirred at 25° C. to 30° C. for four hours and then filtered.

The resultant reaction product was subjected to GPC analysis, and the product was found to have a weight average molecular weight of 2,000 in terms of standard polystyrene. The reaction product is assumed to be a copolymer having a structural unit of the following Formula (10).

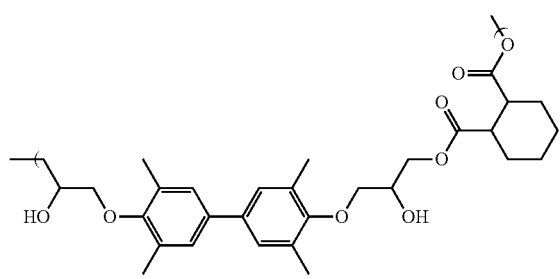

(10)

Comparative Synthesis Example 2

To 7.57 g of PGME were added 17.67 g of PGMEA, 5.00 g of trade name: EHPE-3150 (available from Daicel Corporation), 3.11 g of 9-anthracenecarboxylic acid, 2.09 g of benzoic acid, and 0.62 g of ethyltriphenylphosphonium bromide, and the resultant mixture was refluxed under heating for 13 hours in a nitrogen atmosphere. To the resultant solution were added 16 g of a cation exchange resin (product name: Amberlyst [registered trademark] 15JWET, available from ORGANO CORPORATION) and 16 g of an anion exchange resin (product name: DOWEX [registered trademark] MONOSPHERE [registered trademark] 550A, available from MUROMACHI TECHNOS CO., LTD.), and the resultant mixture was stirred at 25° C. to 30° C. for four hours and then filtered.

The resultant reaction product was subjected to GPC analysis, and the product was found to have a weight average molecular weight of 4,700 in terms of standard polystyrene. The reaction product is assumed to be a copolymer having structural units of the following Formula (11).

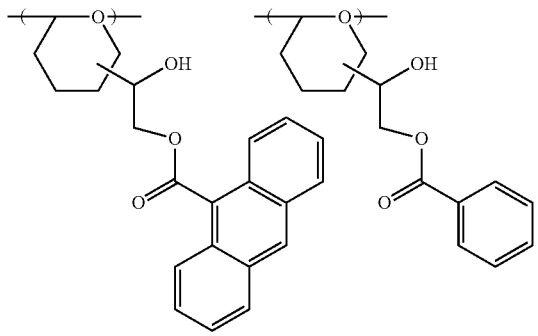

(11)

[Preparation of Resist Underlayer Film-Forming Composition]

Example 1

Firstly, 5.74 g of the solution containing 1.16 g of the copolymer prepared in Synthesis Example 1 (solvent: PGME used for the synthesis, solid content: 20.18 wt %) was mixed with 8.49 g of PGME, 5.65 g of PGMEA, and 0.12 g of 1 wt % PGME solution of a surfactant (trade name: R-30N, available from DIC Corporation), to thereby prepare a 5.8% by mass solution. The solution was filtered with a polytetrafluoroethylene-made micro filter having a pore size of 0.2 μm, to thereby prepare a resist underlayer film-forming composition.

Example 2

Firstly, 7.20 g of the solution containing 1.30 g of the copolymer prepared in Synthesis Example 2 (solvent: PGME used for the synthesis, solid content: 18.05 wt %) was mixed with 7.06 g of PGME, 5.61 g of PGMEA, and 0.13 g of 1 wt % PGME solution of a surfactant (trade name: R-30N, available from DIC Corporation), to thereby prepare a 6.5% by mass solution. The solution was filtered with a polytetrafluoroethylene-made micro filter having a pore size of 0.2 μm, to thereby prepare a resist underlayer film-forming composition.

Example 3

Firstly, 7.07 g of the solution containing 1.30 g of the copolymer prepared in Synthesis Example 3 (solvent: PGME used for the synthesis, solid content: 18.38 wt %) was mixed with 7.19 g of PGME, 5.61 g of PGMEA, and 0.13 g of 1 wt % PGME solution of a surfactant (trade name: R-30N, available from DIC Corporation), to thereby prepare a 6.5% by mass solution. The solution was filtered with a polytetrafluoroethylene-made micro filter having a pore size of 0.2 μm, to thereby prepare a resist underlayer film-forming composition.

Example 4

Firstly, 3.47 g of the solution containing 0.70 g of the copolymer prepared in Synthesis Example 1 (solvent: PGME used for the synthesis, solid content: 20.18 wt %) was mixed with 3.74 g of PGME, 2.72 g of PGMEA, and 0.07 g of 1 wt % PGMEA solution of a surfactant (trade name: R-30N, available from DIC Corporation). The resultant solution was filtered with a polytetrafluoroethylene-made micro filter having a pore size of 0.2 μm, to thereby prepare a resist underlayer film-forming composition.

Example 5

Firstly, 1.73 g of the solution containing 0.35 g of the copolymer prepared in Synthesis Example 1 (solvent: PGME used for the synthesis, solid content: 20.18 wt %) was mixed with 1.18 g of 29.68 wt % PGMEA solution of GT-401 (trade name: Epoleed GT401, available from Daicel Corporation), 5.13 g of PGME, 1.69 g of PGMEA, and 0.28 g of 1 wt % PGMEA solution of a surfactant (trade name: R-30N, available from DIC Corporation). The resultant solution was filtered with a polytetrafluoroethylene-made micro filter having a pore size of 0.2 μm, to thereby prepare a resist underlayer film-forming composition.

Example 6

Firstly, 3.90 g of the solution containing 0.79 g of the copolymer prepared in Synthesis Example 1 (solvent: PGME used for the synthesis, solid content: 20.18 wt %) was mixed with 0.88 g of 29.68 wt % PGMEA solution of GT-401 (trade name: Epoleed GT401, available from Daicel Corporation), 6.65 g of PGME, 3.36 g of PGMEA, and 0.21 g of 1 wt % PGMEA solution of a surfactant (trade name: R-30N, available from DIC Corporation). The resultant solution was filtered with a polytetrafluoroethylene-made micro filter having a pore size of 0.2 μm, to thereby prepare a resist underlayer film-forming composition.

Comparative Example 1

Firstly, 2.29 g of the solution containing 0.60 g of the copolymer prepared in Comparative Synthesis Example 1 (solvent: PGME used for the synthesis, solid content: 26.18 wt %) was mixed with 4.89 g of PGME, 2.76 g of PGMEA, and 0.060 g of 1 wt % PGME solution of a surfactant (trade name: R-30N, available from DIC Corporation), to thereby prepare a 6.0% by mass solution. The solution was filtered with a polytetrafluoroethylene-made micro filter having a pore size of 0.2 μm, to thereby prepare a resist underlayer film-forming composition.

Comparative Example 2

Firstly, 19.52 g of the solution containing 4.51 g of the copolymer prepared in Comparative Synthesis Example 2 (solvent: PGME/PGMEA mixed solvent used for the synthesis, solid content: 23.26 wt %) was mixed with 1.14 g of tetramethoxymethyl glycoluril (product name: POWDERLINK [registered trademark] 1174, available from Cytec Industries Japan), 3.41 g of 1 wt % PGME solution of pyridinium p-toluenesulfonate, 50.68 g of PGME, 14.80 g of PGMEA, and 0.45 g of 1 wt % PGME solution of a surfactant (trade name: R-30, available from DIC Corporation), to thereby prepare a 6.35% by mass solution. The solution was filtered with a polytetrafluoroethylene-made micro filter having a pore size of 0.2 μm, to thereby prepare a resist underlayer film-forming composition.

[Test for Elution in Photoresist Solvent]

Each of the resist underlayer film-forming compositions prepared in Examples 1 to 3 and Comparative Examples 1 and 2 was applied onto a silicon wafer with a spinner. Thereafter, the composition was baked on a hot plate at a temperature shown in Table 1 below for one minute, to thereby form a resist underlayer film (thickness: 0.2 μm). The resist underlayer film was immersed in solvents used for a photoresist solution; i.e., PGME and PGMEA. The results are shown in Table 1 below; specifically, "O" in the case of insoluble in both these solvents. The film formed from the composition of Comparative Example 1 was dissolved in both these solvents, and thus the film was not subjected to the subsequent test.

Each of the resist underlayer film-forming compositions prepared in Examples 4 to 6 was baked at a temperature shown in Table 1 below in a manner similar to the cases of Examples 1 to 3, and then irradiated with ultraviolet rays by using an ultraviolet irradiation apparatus including a UV irradiation unit (wavelength: 172 nm) available from USHIO INC. at 500 mJ/cm2, to thereby form a resist underlayer film (thickness: 0.2 μm). Thereafter, the test was performed in the same manner as in Examples 1 to 3. The photocurable material is not cured at a temperature shown in Table 1, but is cured by light. Thus, the test results indicated that the film is dissolved in a photoresist solution after baking, and becomes insoluble in the solution after photoirradiation.

[Test for Optical Parameters]

Each of the resist underlayer film-forming compositions prepared in Examples 1 to 6 and Comparative Example 2 was applied onto a silicon wafer with a spinner. Thereafter, the composition was baked on a hot plate at a temperature shown in Table 1 below for one minute, to thereby form a resist underlayer film (thickness: 0.2 μm). In Examples 4 to 6, after baking at a predetermined temperature, the film was cured through irradiation with ultraviolet rays by using an ultraviolet irradiation apparatus including a UV irradiation unit (wavelength: 172 nm) at 500 mJ/cm2. Subsequently, the refractive index (n value) and attenuation coefficient (k value) of the resist underlayer film were measured at a wavelength of 193 nm with an optical ellipsometer (VUV-VASE VU-302, available from J. A. Woollam). The results are shown in Table 1 below. The k value at a wavelength of 193 nm is preferably 0.1 or more in view that the resist underlayer film has a sufficient antireflective function.

TABLE 1

| | Baking temperature | 172 nm photoirradiation | Solvent resistance Examples 1-3 | | Solvent resistance Examples 4-6 during baking | | Solvent resistance Examples 4-6 during photocuring | | Optical parameters 193 nm | | |
|---|---|---|---|---|---|---|---|---|---|---|---|
| | (deg. C.) | (mJ/cm2) | PGME | PGMEA | PGME | PGMEA | PGME | PGMEA | n value | k value | Planarity |
| Example 1 | 300 | — | O | O | — | — | — | — | 1.47 | 0.53 | O |
| Example 2 | 300 | — | O | O | — | — | — | — | 1.49 | 0.47 | O |
| Example 3 | 300 | — | O | O | — | — | — | — | 1.51 | 0.44 | O |
| Example 4 | 215 | 500 | — | — | X | X | O | O | 1.46 | 0.53 | O |
| Example 5 | 215 | 500 | — | — | X | X | O | O | 1.50 | 0.43 | O |
| Example 6 | 240 | 500 | — | — | X | X | O | O | 1.58 | 0.31 | O |

TABLE 1-continued

|  | Baking temperature (deg. C.) | 172 nm photoirradiation (mJ/cm2) | Solvent resistance Examples 1-3 | | Solvent resistance Examples 4-6 during baking | | Solvent resistance Examples 4-6 during photocuring | | Optical parameters 193 nm | | Planarity |
|---|---|---|---|---|---|---|---|---|---|---|---|
|  |  |  | PGME | PGMEA | PGME | PGMEA | PGME | PGMEA | n value | k value |  |
| Comparative Example 1 | 300 | — | X | X | — | — | — | — | — | — | — |
| Comparative Example 2 | 215 | — | ○ | ○ | — | — | — | — | 1.64 | 0.26 | X |

[Test for Coating of Multi-Level Substrate]

For evaluation of planarity, the thicknesses of portions of a coating film were compared on an SiO2 substrate having a thickness of 230 nm, the comparison being performed between a trench pattern area (TRENCH) (trench width: 50 nm, pitch: 100 nm) and a non-patterned open area (OPEN). Each of the resist underlayer film-forming compositions of Examples 1 to 6 and Comparative Example 2 was applied onto the aforementioned substrate so as to achieve a coating thickness of 200 nm, and then baked on a hot plate at a temperature shown in Table 1 above for one minute, to thereby form a resist underlayer film (thickness: 0.2 μm). In Examples 4 to 6, after baking at a predetermined temperature, the film was cured through irradiation with ultraviolet rays by using an ultraviolet irradiation apparatus including a UV irradiation unit (wavelength: 172 nm) at 500 mJ/cm2. For evaluation of coating of the multi-level substrate (planarity), the substrate was observed with a scanning electron microscope (S-4800) available from Hitachi High-Technologies Corporation, followed by measurement of the difference between the thickness of the substrate at the trench area (patterned area) and that at the open area (non-patterned area) (i.e., the difference in coating level between the trench area and the open area, which is called "Bias"). Table 2 shows the thicknesses of these areas and the difference in coating level. Bias (difference in coating level) can be used for evaluation of the planarity; i.e., the smaller the Bias, the higher the planarity.

TABLE 2

|  | Dense Thickness (nm) | OPEN Thickness (nm) | Dense/OPEN Difference in coating level (nm) |
|---|---|---|---|
| Example 1 | 157 | 183 | 26 |
| Example 2 | 149 | 189 | 40 |
| Example 3 | 151 | 179 | 28 |
| Example 4 | 191 | 175 | 16 |
| Example 5 | 179 | 165 | 14 |
| Example 6 | 183 | 174 | 9 |
| Comparative Example 1 | — | — | — |
| Comparative Example 2 | 135 | 212 | 77 |

The results of comparison of planarity indicate that the difference in coating level between the patterned area and the open area in Examples 1 to 6 is smaller than that in Comparative Example 2. Thus, the resist underlayer film formed from each of the resist underlayer film-forming compositions of Examples 1 to 6 exhibits good planarity. Although the materials of Examples 1 and 4 have the same composition, the planarity of the film formed from the same material can be improved through photocuring.

INDUSTRIAL APPLICABILITY

The resist underlayer film-forming composition of the present invention exhibits high reflow properties after being applied to a substrate and then heated. Thus, the composition can be evenly applied onto a multi-level substrate to thereby form a flat film. The composition is useful for forming a resist underlayer film since it has an appropriate antireflective effect.

The invention claimed is:

1. A resist underlayer film-forming composition comprising a copolymer having a repeating structural unit of the following Formula (1) and/or a repeating structural unit of the following Formula (2) and an organic solvent:

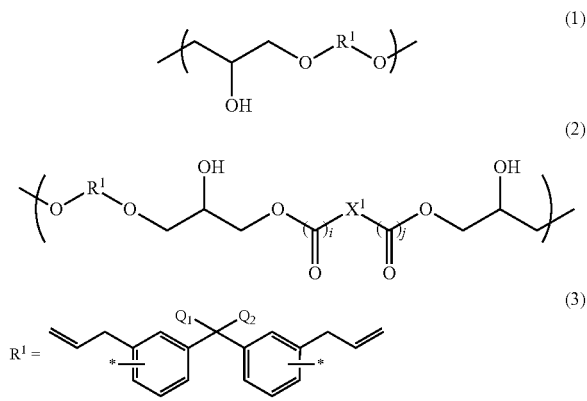

(in Formulae (1) and (2), $R^1$ is a functional group of Formula (3); in Formula (3), $Q_1$ and $Q_2$ are each independently a hydrogen atom or a $C_{1-5}$ alkyl group, and * is a dangling bond to an oxygen atom; and in Formula (2), $X^1$ is a $C_{1-50}$ organic group, and i and j are each independently 0 or 1).

2. The resist underlayer film-forming composition according to claim 1, wherein the functional group of Formula (3) is a group of the following Formula (4):

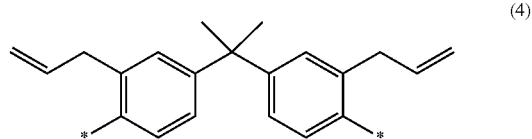 [SMILES: *c1ccc(C(C)(C)c2ccc(*)c(CC=C)c2)cc1CC=C]

(wherein * is a dangling bond to an oxygen atom).

3. The resist underlayer film-forming composition according to claim 1, wherein, in the repeating structural unit of Formula (2), $X^1$ is a linear, branched, or cyclic divalent hydrocarbon group having a carbon atom number of 2 to 20, a linear, branched, or cyclic divalent organic group having a carbon atom number of 2 to 20 and at least one sulfur atom or oxygen atom, or a divalent organic group containing at least one $C_{6-20}$ aromatic ring or $C_{3-12}$ heterocyclic ring, and the heterocyclic ring has at least one sulfur atom or oxygen atom.

4. The resist underlayer film-forming composition according to claim 1, wherein the copolymer contains a repeating structural unit formed from an $R^1$-containing monomer in an amount of 25% or more.

5. The resist underlayer film-forming composition according to claim 1, wherein the composition further comprises a photo-crosslinking agent.

6. The resist underlayer film-forming composition according to claim 1, wherein the composition further comprises a compound of the following Formula (5) and/or a compound of the following Formula (6):

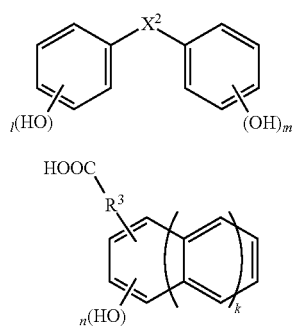

(wherein $X^2$ is a carbonyl group or a methylene group; l and m are each independently an integer of 0 to 5 and satisfy a relation of 3≤l+m≤10; $R^3$ is a $C_{1-4}$ alkylene group or alkenylene group or a single bond; k is 0 or 1; and n is an integer of 2 to 4).

7. The resist underlayer film-forming composition according to claim 1, wherein the composition further comprises a surfactant.

8. A method for producing a resist underlayer film, the method comprising a step of applying the resist underlayer film-forming composition according to claim 1 to a multi-level substrate; and a heating step of thermally curing the composition.

9. The method for producing a resist underlayer film according to claim 8, wherein the heating temperature in the heating step is 200° ° C. to 300° ° C.

10. The method for producing a resist underlayer film according to claim 9, wherein the method further comprises a light exposure step.

11. A method for producing a resist underlayer film without a light exposure step, the method comprising a step of applying the resist underlayer film-forming composition according to claim 1 to a multi-level substrate; and a heating step of thermally curing the composition at 250° C. or higher.

* * * * *